(12) United States Patent
Carr

(10) Patent No.: US 6,501,657 B1
(45) Date of Patent: Dec. 31, 2002

(54) TORSIONAL HEAT SINK RETENTION DEVICE

(75) Inventor: Daniel S. Carr, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/054,389

(22) Filed: Jan. 22, 2002

(51) Int. Cl.$^7$ .................................................. H05K 7/20
(52) U.S. Cl. ...................... 361/704; 361/707; 361/709; 257/713; 165/185; 174/16.3
(58) Field of Search ......................... 361/684, 687–689, 361/692, 702–710, 714–719, 726, 732, 737, 740–742, 747, 752–756, 758–759, 800–807; 312/223.1, 223.2; 257/706–727; 165/80.2, 80.3, 80.4, 185; 211/41.17; 439/330, 331, 487, 342, 64, 95, 377, 485–486; 24/473, 625, 453, 457, 458, 527; 248/7, 316, 500, 505, 510; 174/15.1, 15.2, 16.3, 252; 267/150, 160

(56) References Cited

U.S. PATENT DOCUMENTS

| 5,331,507 | A |   | 7/1994 | Kyung et al. |
| 5,448,449 | A |   | 9/1995 | Bright et al. |
| 5,600,540 | A |   | 2/1997 | Blomquist |
| 6,243,267 | B1 | * | 6/2001 | Chuang ........................ 361/704 |
| 6,280,222 | B1 | * | 8/2001 | Walkup ....................... 439/331 |

* cited by examiner

Primary Examiner—Darren Schuberg
Assistant Examiner—Michael Datskovsky
(74) Attorney, Agent, or Firm—Haynes and Boone, LLP

(57) ABSTRACT

A heat sink retention apparatus includes a frame having a first end and a second end. A rotatable shaft is mounted on the frame. A heat sink retention arm is provided on the shaft and is rotatable with the shaft between a lock position and an unlock position. A driven member is provided on the shaft. The driven member includes a slot and a plurality of grooves. A rotatable driving member is mounted on the frame adjacent the driven member. A tab on the driving member engages the slot for rotating the driven member in response to rotation of the driving member. A plurality of arcuate members on the driving member engage the grooves in response to rotation of the driving member. As a result, the retention arm is movable between the lock position and the unlock position.

27 Claims, 11 Drawing Sheets

TORSIONAL HEAT SINK RETENTION DEVICE

BACKGROUND

The disclosures herein relate generally to a computer system and more particularly to retention of a heat sink for cooling the computer system.

As the speed of computer microprocessors continues to increase, the heat that they are generating increases. Heat dissipating bodies such as heat sinks are often used to cool microprocessors. Faster processors are requiring larger, heavier heat sinks whose weight can cause the computer board to bend and flex when the heat sink is mounted to the board and when the board is subject to shock and vibrations while mounted to the computer chassis. Flexing of the computer board can be extremely damaging to the traces and components on the board.

Increased processor power has demanded heavier heat sinks and stronger heat sink clips and fasteners. Presently used clips require a large amount of force to open and close. In addition, if a clip is incorrectly installed, damage to the motherboard may result.

The use of higher force clips causes ergonomic issues for manufacturing personnel. As a result, an installation tool may be needed to supply a needed mechanical advantage. This can create a problem for field service repair needing the tool for removal and replacement.

In order to preserve contact between the processor and the heat sink, some clips create a large amount of preload force.

One approach has used metal leaf springs placed on each side of the heat sink and attached to a plastic base. This approach creates an accessibility issue inside the chassis creating multiple areas that need to be accessed in order to assemble and disassemble the heat sink.

Another approach is a metal clip that spans across the middle of the heat sink and attaches to the socket. This creates a single contact area on the sink which permits the sink to wobble. This approach is no longer feasible because the newer sockets are too small.

Therefore, what is needed is a heat sink retention apparatus which provides sufficient retention during shock events, and which provides an optional thermal interface between the heat sink and a processor with which the heat sink is engaged.

SUMMARY

One embodiment, accordingly, provides a torsionally originated force to retain a heat sink. To this end, a frame has a first end and a second end. A rotatable shaft is mounted on the frame. A heat sink retention arm is provided on the shaft and is rotatable with the shaft between a lock position and an unlock position. A driven member is provided on the shaft. The driven member includes a slot and a plurality of grooves. A rotatable driving member is mounted on the frame adjacent the driven member. A tab on the driving member engages the slot for rotating the driven member in response to rotation of the driving member. A plurality of arcuate members on the driving member engage the grooves in response to rotation of the driving member. As a result, the retention arm is movable between the lock position and the unlock position.

A principal advantage of this embodiment is advantage of this embodiment is reduced manufacturing time and easy access for repair or replacement. The torsion spring also provides a preload on the processor socket and limits tolerance stack-up of the processor.

DETAILED DESCRIPTION

Figure 1:
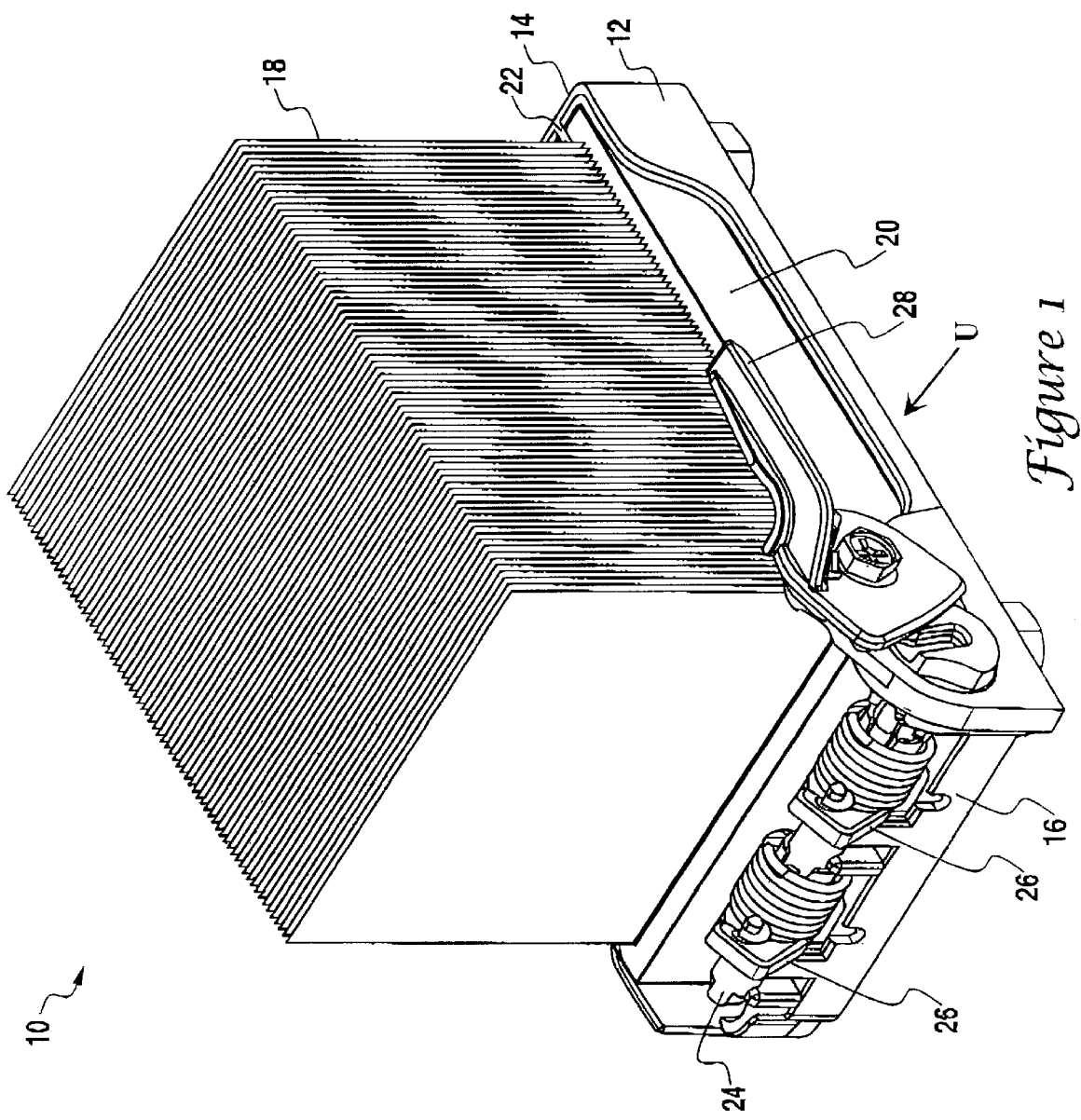
FIGS. 1 and 2 are perspective views illustrating an embodiment of a heat sink retention apparatus.
Figure 2:
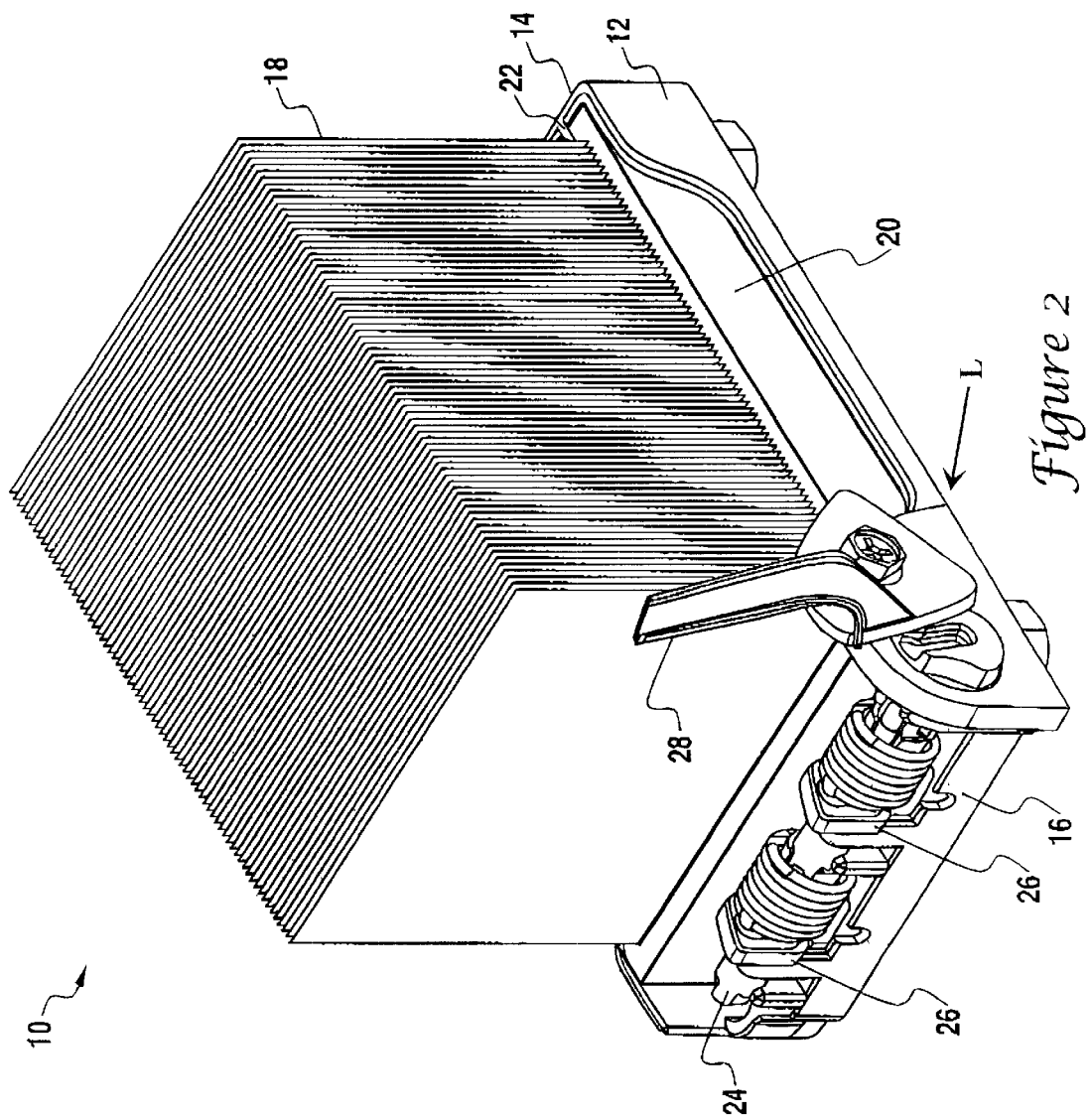
Figure 3:
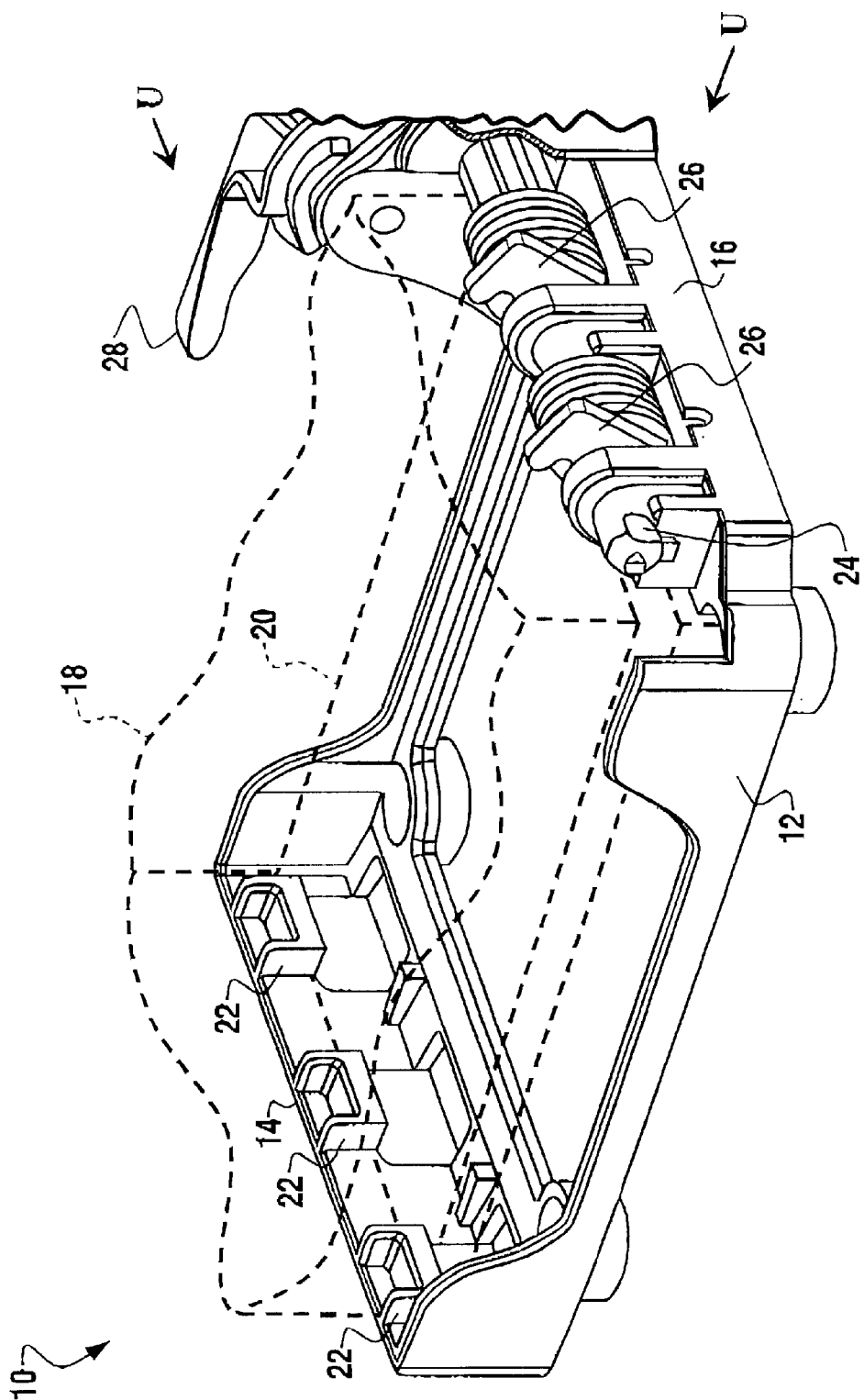
FIG. 3 is perspective view illustrating an embodiment of a heat sink retention apparatus.

A heat sink retention apparatus FIGS. 1, 2 and 3, is generally designated 10. A frame 12 of apparatus 10 includes a first end 14 and a second end 16. A heat sink 18 is mounted in frame 12 and a base 20 of the heat sink 18 is retained under a plurality of protrusions 22 positioned at first end 14. A rotatable shaft 24 is mounted on the second end 16 of frame 12. At least one heat sink retention arm 26 is mounted on shaft 24 and is rotatable with shaft 24 between a lock position L and an unlock position U (discussed later in greater detail). When in the lock position L, the retention arm 26, and preferably a plurality of retention arms 26, engages the base 20 of the heat sink 18 at the second end 16 of the frame 12. The shaft 24 is moved by a lever arm 28, discussed below, which moves the retention arms between the lock position L and the unlock position U.

Figure 4:
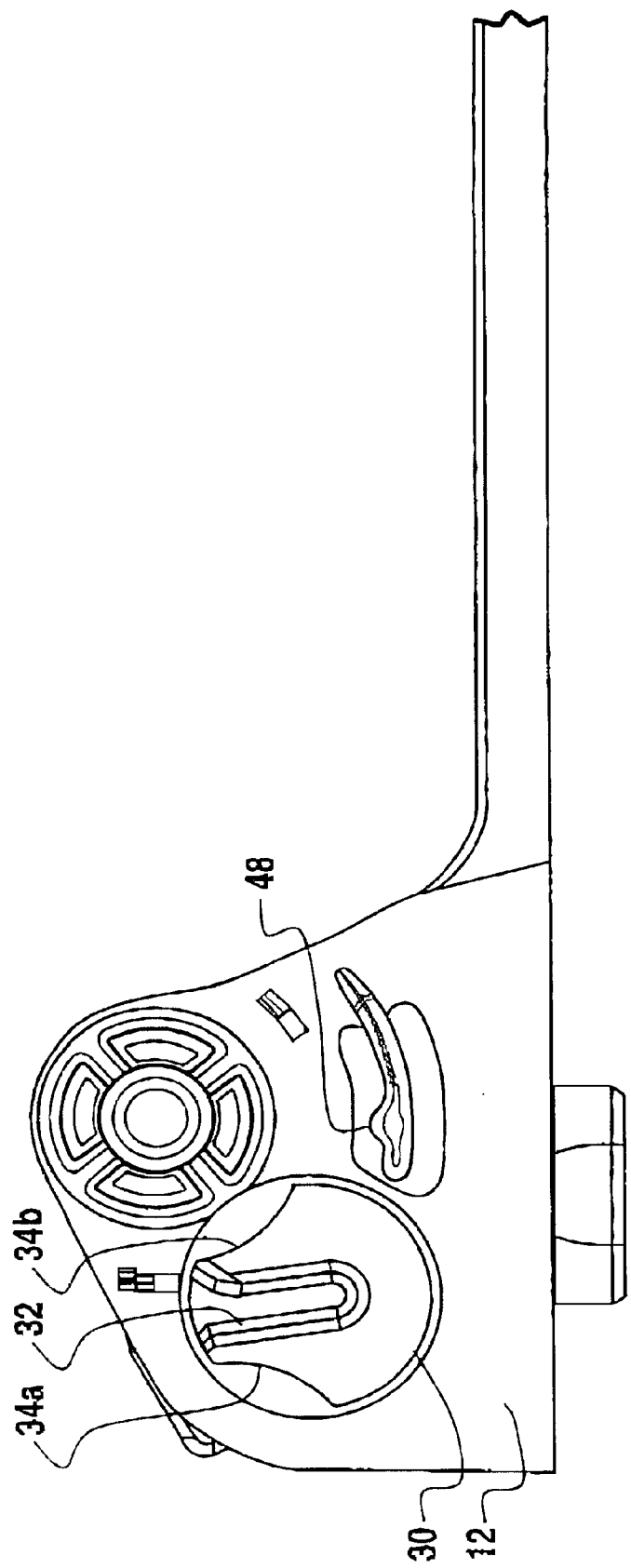
FIG. 4 is a partial side view illustrating an embodiment of the frame.
Figure 5:
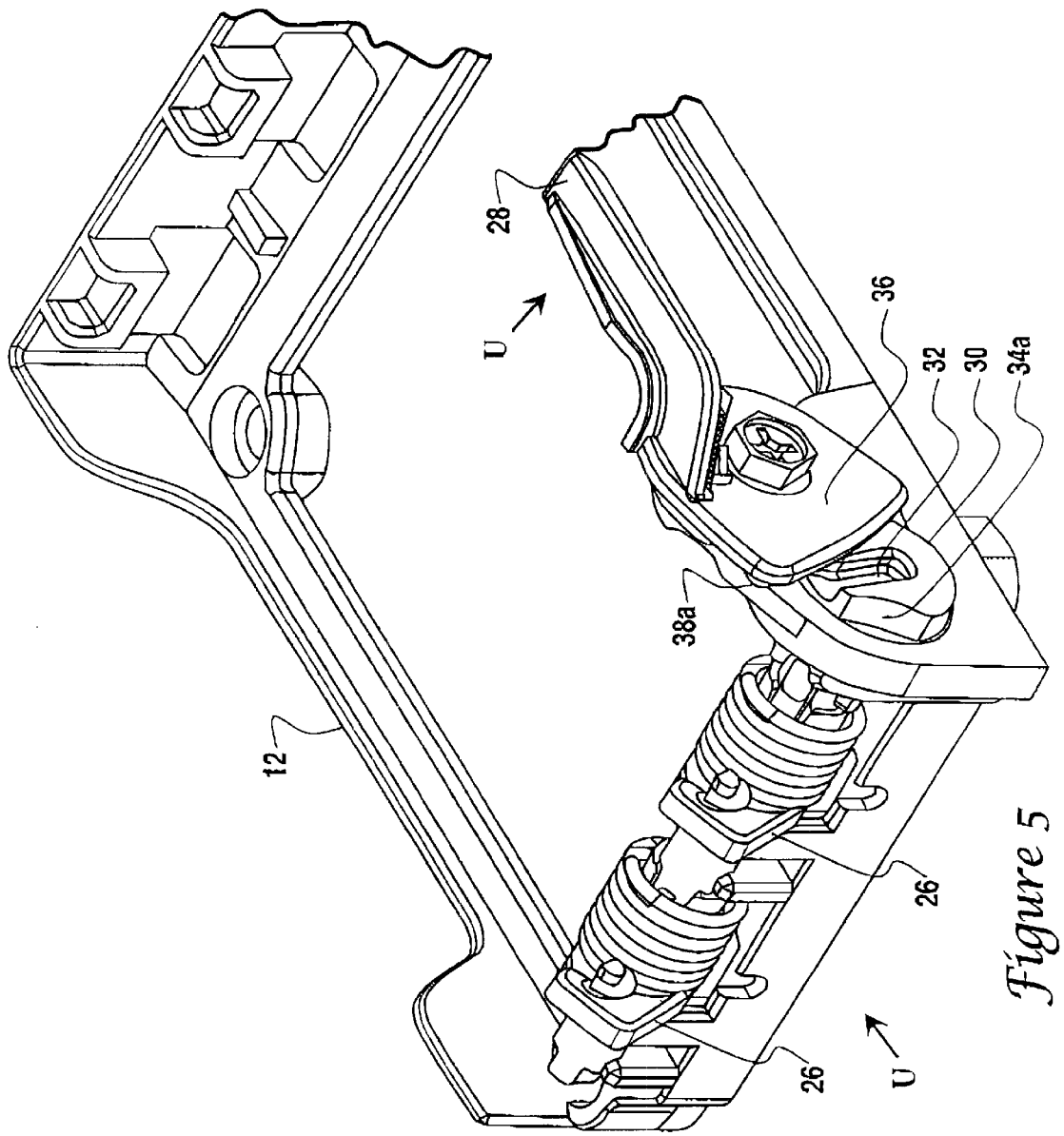
FIG. 5 is a partial perspective view illustrating an embodiment of the frame.
Figure 6:
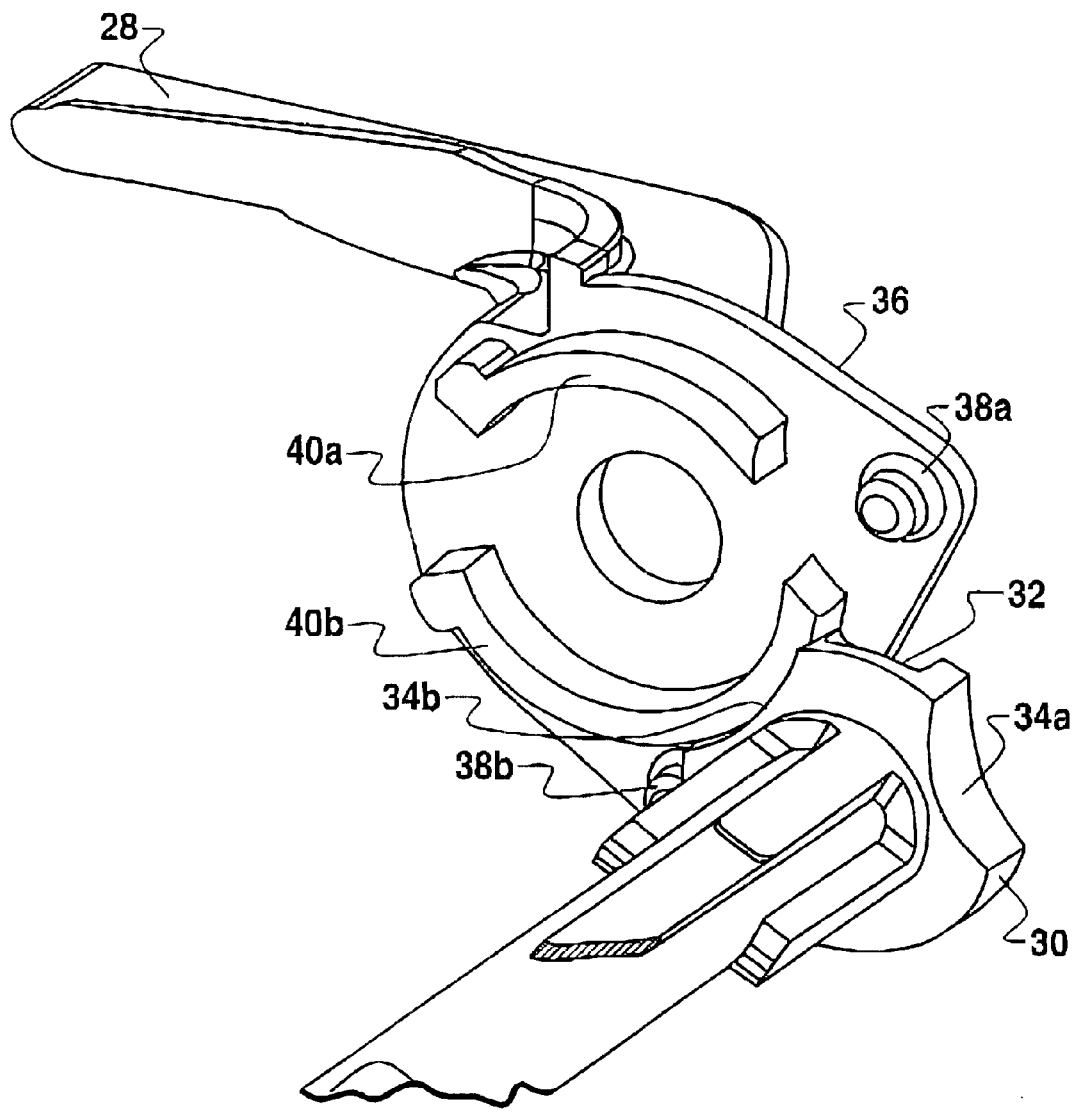
FIG. 6 is a partial perspective view illustrating an embodiment of the shaft and drive lever.

Shaft 24 includes a driven member 30, FIG. 4, including a slot 32 positioned between a plurality of arcuate grooves 34a and 34b formed therein. A rotatable driving member 36, FIGS. 5 and 6, is mounted on frame 12 adjacent the driven member 30. The lever arm 28 is attached to move the driving member 36. A tab 38a on the driving member 36 engages the slot 32 in response to rotational movement of the driving member 36. The driving member 36 also includes a plurality of arcuate members 40a, 40b, for engagement of the grooves 34a, 34b, respectively, in response to rotation of the driving member 36, whereby the retention arms 26 are movable between the lock position L and the unlock position U. Tab 38a is positioned between arcuate members 40a and 40b.

Figure 7:
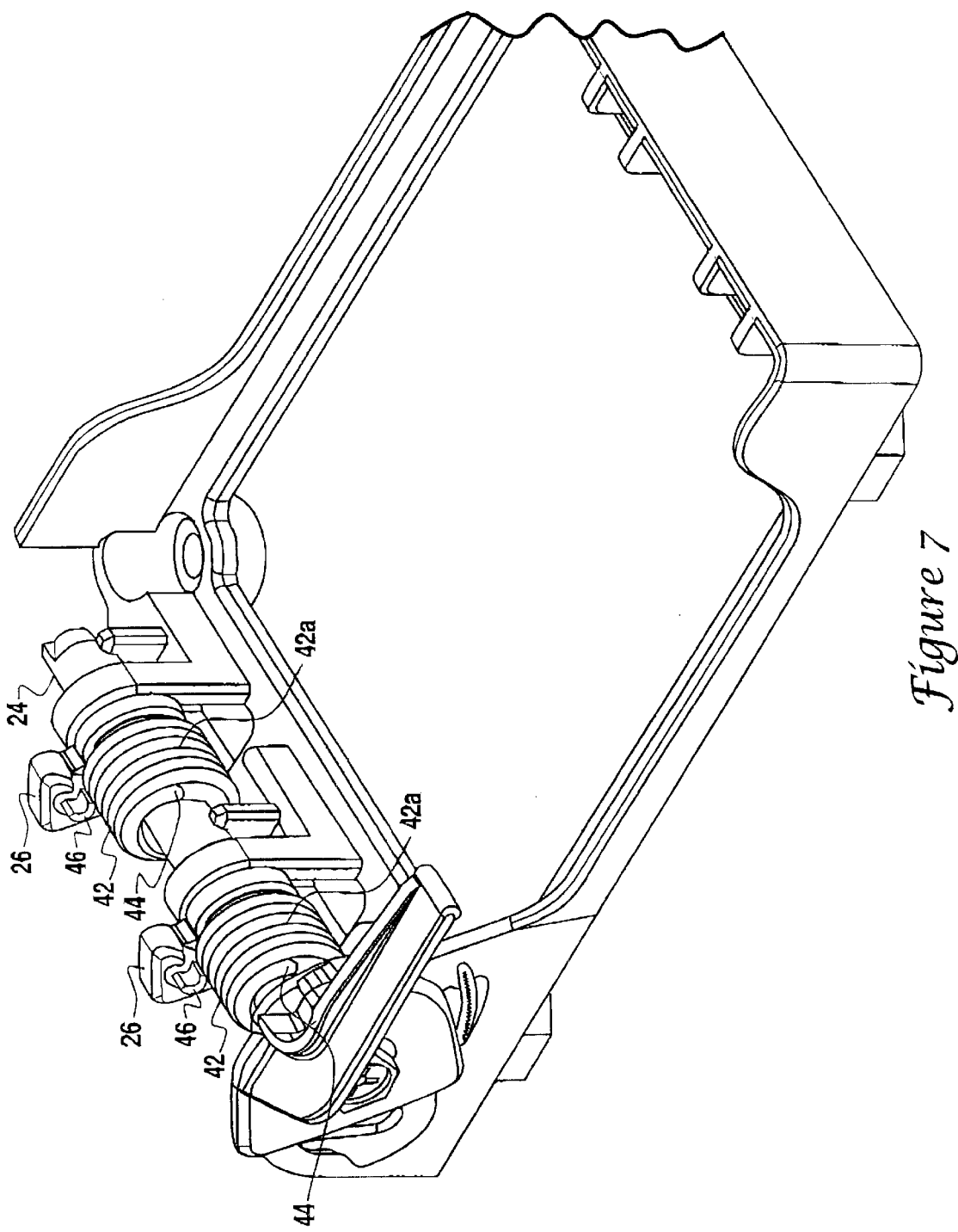
FIG. 7 is a partial perspective view illustrating an embodiment of the frame.

A resilient member 42, FIG. 7, is engaged with the shaft 24 and with the heat sink retention arms 26. Preferably, there are a plurality of resilient members 42 on shaft 24. Each resilient member 42 includes a body portion 42a wound around the shaft 24, a first terminal end 44 engaged with the shaft 24 and a second terminal end 46 engaged with an adjacent heat sink retention arm 26.

Figure 8:
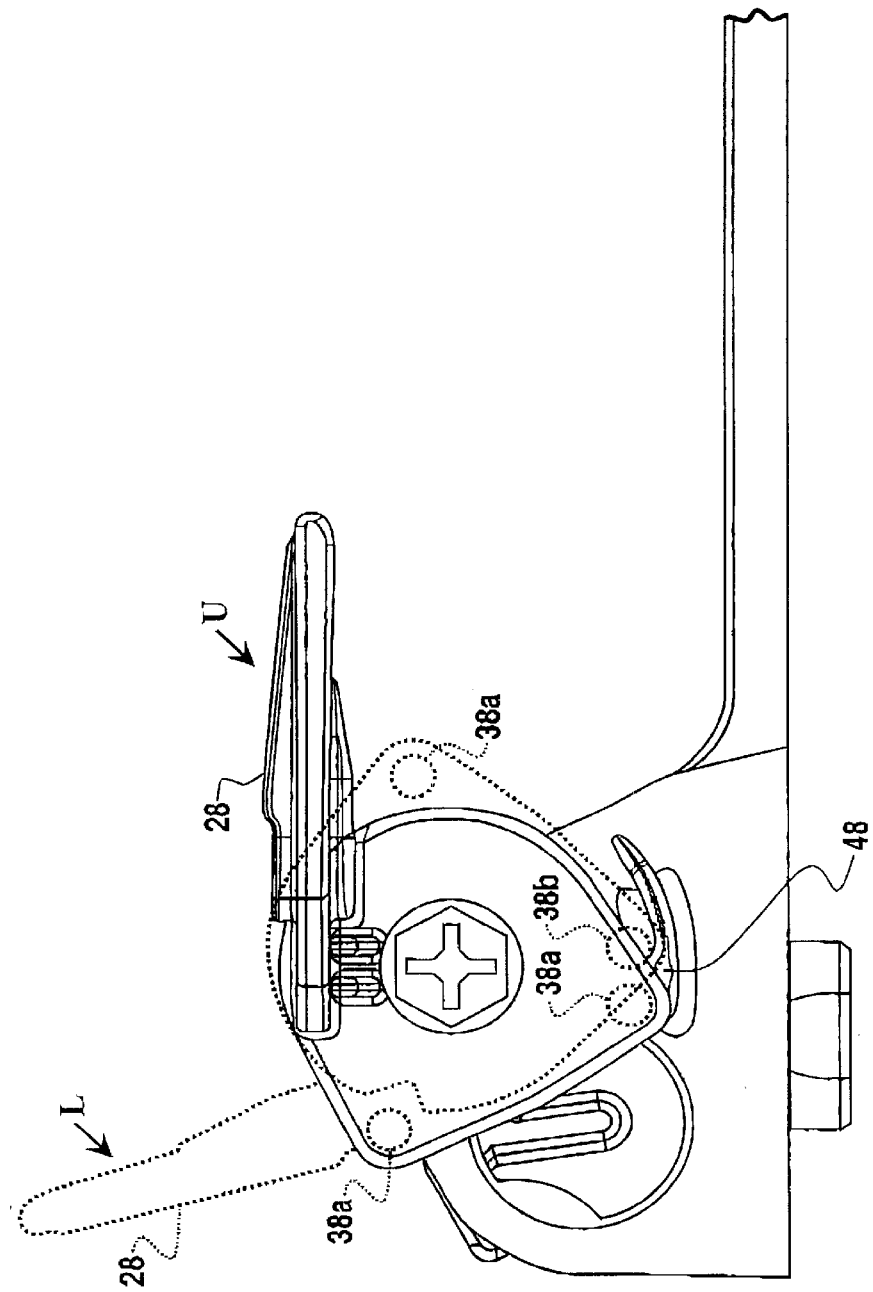
FIG. 8 is a partial side view illustrating an embodiment of the drive lever and frame.
Figure 9:
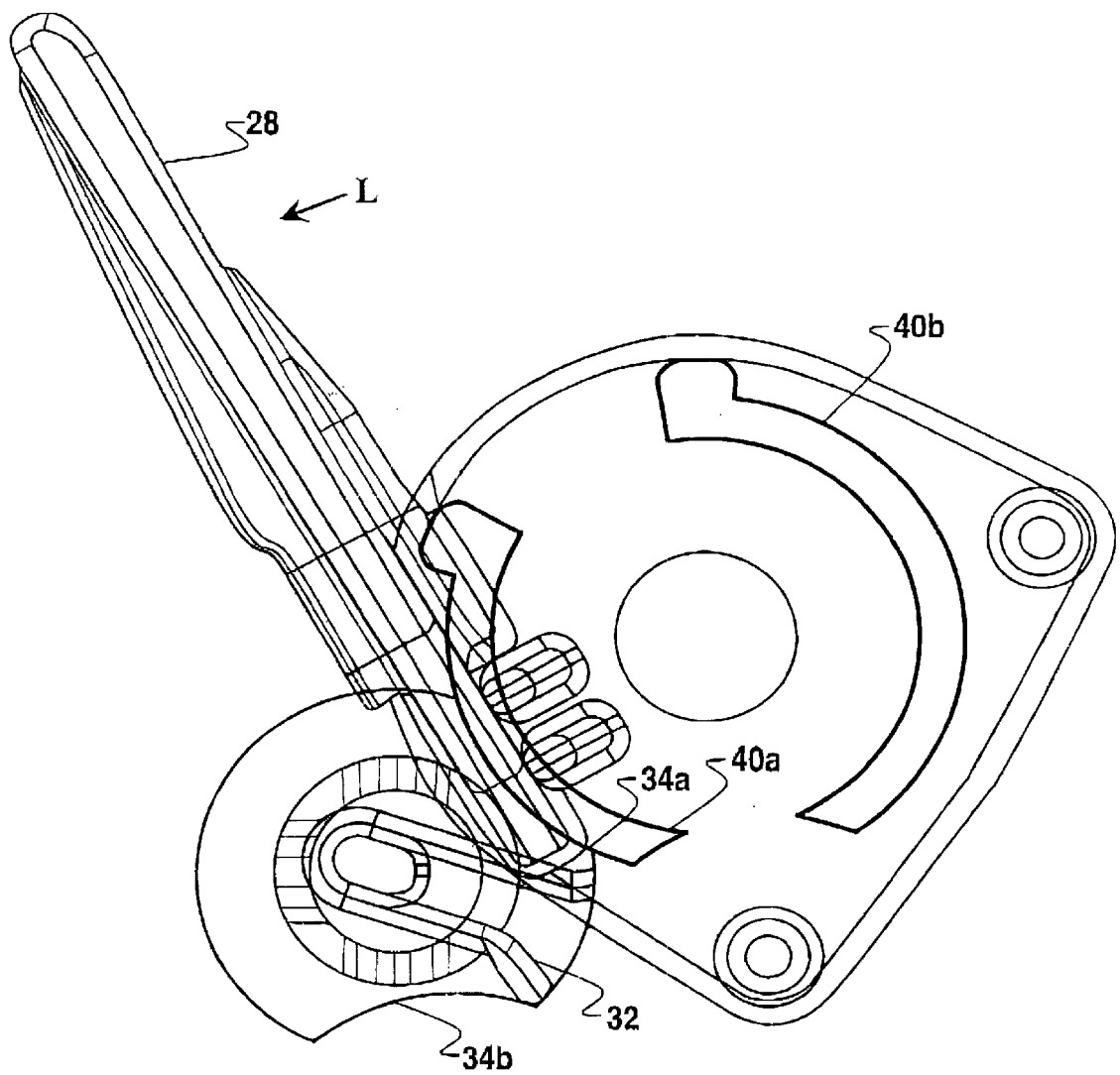
FIGS. 9 and 10 are partial side views illustrating an embodiment of the drive lever.
Figure 10:
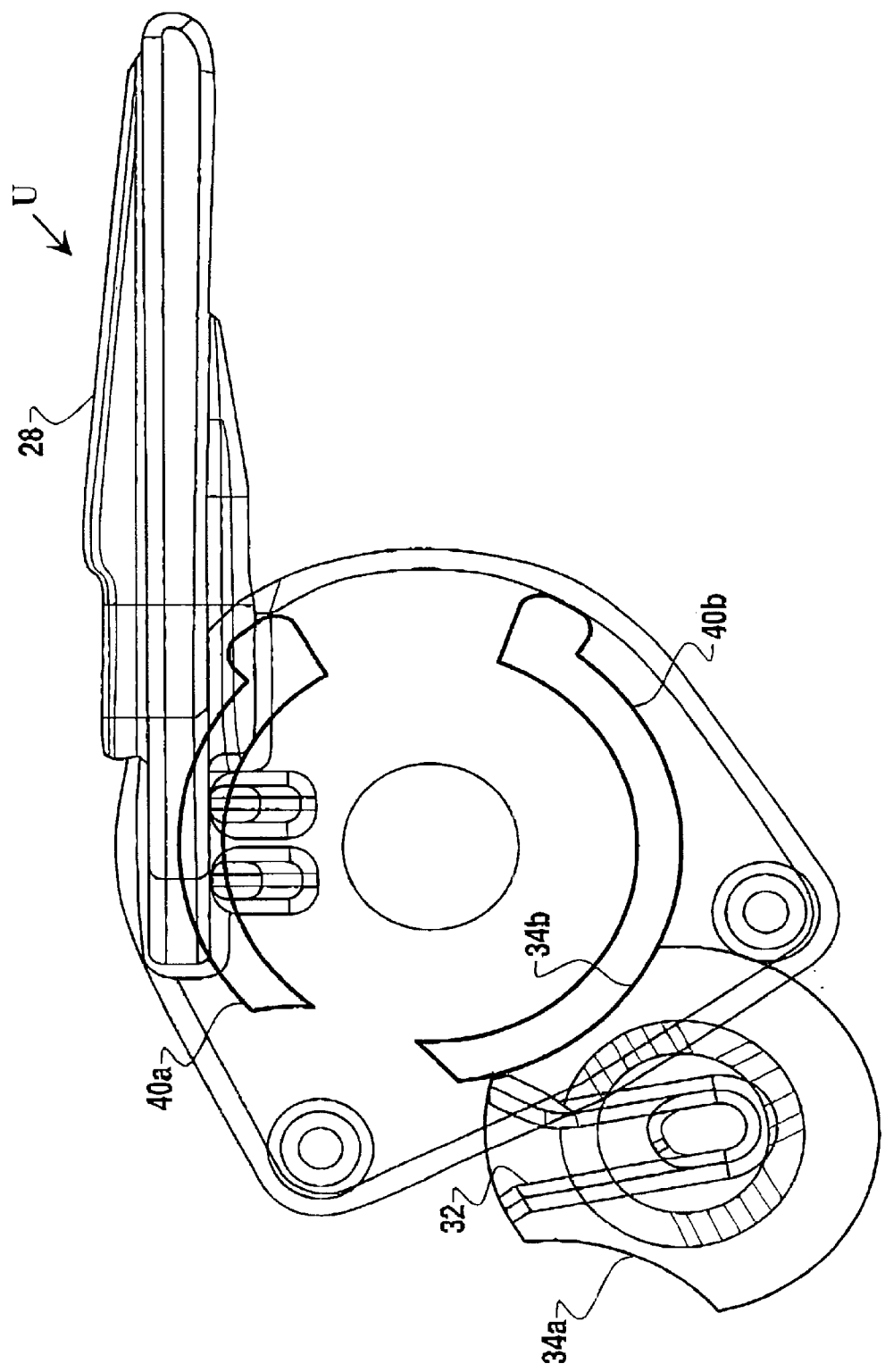

A detent 48, FIG. 4, is mounted in cantilever fashion on the frame 12 for engagement with the driving member 36. More specifically, the tab member 38a and another tab member 38b, FIGS. 6 and 8 engage the detent 48. The tab member 38*b* engages the detent 48 in the unlock position U, and the tab member 38*a* engages the detent 48 in the lock position L. Also, the arcuate member 40*a* engages the groove 34*a* in the lock position L, FIG. 9, and the arcuate member 40*b* engages the groove 34*b* in the unlock position U, FIG. 10.

Figure 11:
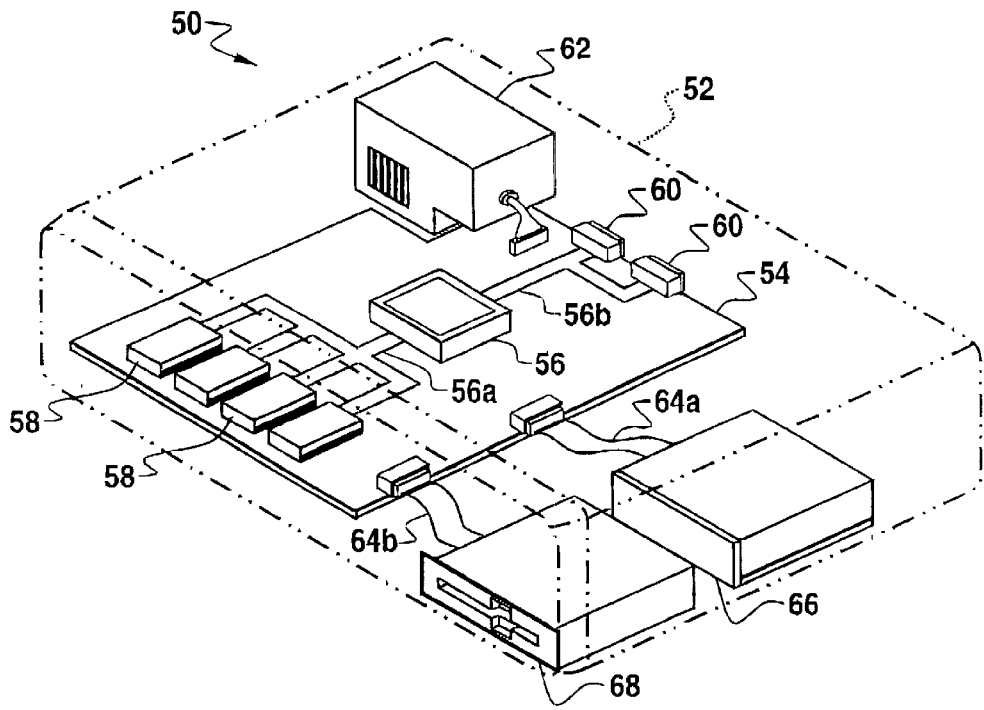
FIG. 11 is a diagrammatic view of a computer system.

FIG. 11 depicts a personal computer, shown in general by the reference numeral 50, which can be in the form of a desktop computer, a tower computer, a server, or the like. The computer 50 includes a chassis 52 in which a motherboard 54 is mounted. A processor 56, a plurality of memory modules 58, and two input/output (I/O) devices 60 are mounted on the motherboard 54. Two buses 56*a* and 56*b* are also provided on the motherboard 54 and connect the processor 56 to the memory modules 58 and to the input/output devices 60, respectively. A power supply 62 is connected to the motherboard 54, and a pair of cable assemblies 64*a* and 64*b* connect the motherboard to a hard drive assembly 66 and a disk drive unit 68, respectively. It is understood that other components, electrical traces, electrical circuits, and related devices (not shown) are provided in the chassis 52. Because these are all conventional, they will not be described in any further detail.

Figure 12:
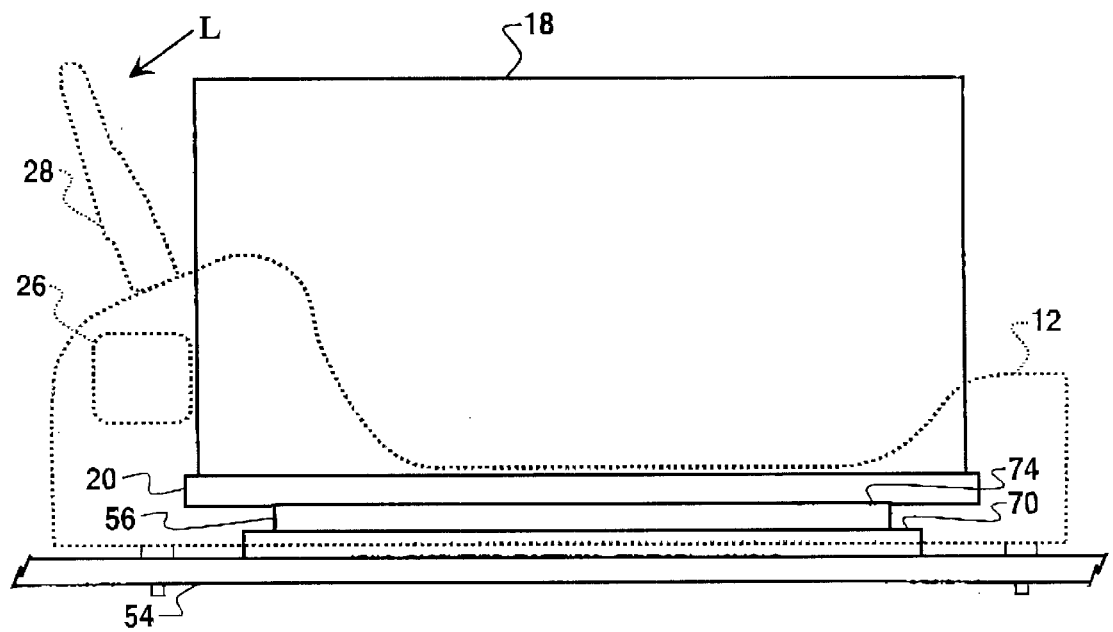
FIG. 12 is a diagrammatic side elevational view illustrating an embodiment of a heat sink mounted on a board.

Further in FIG. 12, a socket 70 is mounted and suitably attached to board 54 and processor 56 is attached to socket 70. The heat sink 18 is mounted in frame 12. Heat sink 18 engages processor 56 at an interface 74 which may include a thermal interface material. Lever 28 is moved to the lock position L, see also FIG. 2. This rotates the retention arms 26 to engage base 20 and urge base 20 into thermal interface with processor 56. Movement of lever 28 to the unlock position U, FIG. 1, moves the retention arms 26 so that heat sink 18 may be removed from frame 12.

As a result of the foregoing, a single lever mechanism to actuate a torsion system that rotates in to place retaining the heat sink against shock events due to shipping. The heat sink is placed into the frame at an angle to "toe in under the static end of the frame then laid to rest on the processor. The lever (starting in its down position) is rotated 120 degrees. During this actuation the torsion system rotates 120 degrees locking down on the heat sink. Once locked down on the sink the system is placing a 25 lb load on the socket, creating an optimal thermal interface. In the case of a shock event the torsion system will create a hard stop and the 25 lb preload will turn into a 75 lb reaction load capable of retaining the sink in its place.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A heat sink retention apparatus comprising:
    a frame having a first end and a second end;
    a rotatable shaft mounted on the second end of the frame;
    a heat sink retention arm on the shaft and rotatable with the shaft between a lock position and an unlock position;
    a driven member on the shaft, the driven member including a slot formed therein and a plurality of grooves formed therein;
    a rotatable driving member mounted on the frame adjacent the driven member;
    a tab on the driving member for engagement with the slot for rotating the driven member in response to rotation of the driving member; and
    a plurality of arcuate members on the driving member for engagement with the grooves in response to rotation of the driving member, whereby the retention arm is movable between the lock position and unlock position.

2. The apparatus as defined in claim 1 further comprising:
    a resilient member engaged with the shaft and with the heat sink retention arm.

3. The apparatus as defined in claim 2 wherein the resilient member has a body wound around the shaft.

4. The apparatus as defined in claim 2 wherein the resilient member has a first terminal end engaged with the shaft and a second terminal end engaged with the heat sink retention arm.

5. The apparatus as defined in claim 1 wherein there are a plurality of spaced apart heat sink retention arms mounted on the shaft.

6. The apparatus as defined in claim 1 further including:
    a detent mounted on the frame for engagement with the driving member.

7. The apparatus as defined in claim 6 wherein the driving member engages the detent in the lock position and in the unlock position.

8. The apparatus as defined in claim 1 wherein one of the arcuate members engages one of the grooves in the lock position and another of the arcuate members engages another one of the grooves in the unlock position.

9. The apparatus as defined in claim 1 wherein the slot is between the grooves and the tab is between the arcuate members.

10. A computer comprising:
    a chassis;
    a circuit board mounted in the chassis;
    a microprocessor mounted on the circuit board;
    a frame mounted on the circuit board, the frame having a first end and a second end;
    a heat sink mounted in the frame, the heat sink abutting the microprocessor;
    a rotatable shaft mounted on the second end of the frame;
    a heat sink retention arm on the shaft and rotatable with the shaft between a lock position for urging the heat sink toward the microprocessor, and an unlock position;
    a driven member on the shaft, the driven member including a slot formed therein and a plurality of grooves formed therein;
    a rotatable driving member mounted on the frame adjacent the driven member;
    a tab on the driving member for engagement with the slot for rotating the driven member in response to rotation of the driving member; and
    a plurality of arcuate members on the driving member for engagement with the grooves in response to rotation of the driving member.

11. The computer as defined in claim 10 further comprising:
    a resilient member engaged with the shaft and with the heat sink retention arm.

12. The computer as defined in claim 11 wherein the resilient member has a body wound around the shaft.

13. The computer as defined in claim 11 wherein the resilient member has a first terminal end engaged with the shaft and a second terminal end engaged with the heat sink retention arm.

14. The computer as defined in claim 10 wherein there are a plurality of spaced apart heat sink retention arms mounted on the shaft.

15. The computer as defined in claim 10 further including:
   a detent mounted on the frame for engagement with the driving member.

16. The computer as defined in claim 15 wherein the driving member engages the detent in the lock position and in the unlock position.

17. The computer as defined in claim 10 wherein one of the arcuate members engages one of the grooves in the lock position and another of the arcuate members engages another one of the grooves in the unlock position.

18. The computer as defined in claim 10 wherein the slot is between the grooves and the tab is between the arcuate members.

19. A computer system comprising:
   a chassis;
   a microprocessor mounted in the chassis;
   an input coupled to provide input to the microprocessor;
   a mass storage coupled to the microprocessor;
   a video controller coupled to the microprocessor;
   a system memory coupled to provide storage to facilitate execution of computer programs by the microprocessor;
   a frame mounted in the chassis, the frame having a first end and a second end;
   a heat sink mounted in the frame, the heat sink abutting the microprocessor;
   a rotatable shaft mounted on the second end of the frame;
   a heat sink retention arm on the shaft and rotatable with the shaft between a lock position, for urging the heat sink toward the microprocessor, and an unlock position;
   a driven member on the shaft, the driven member including a slot formed therein and a plurality of grooves formed therein;
   a rotatable driving member mounted on the frame adjacent the driven member;
   a tab on the driving member for engagement with the slot for rotating the driven member in response to rotation of the driving member; and
   a plurality of arcuate members on the driving member for engagement with the grooves in response to rotation of the driving member.

20. The system as defined in claim 19 further comprising:
   a resilient member engaged with the shaft and with the heat sink retention arm.

21. The system as defined in claim 20 wherein the resilient member has a body wound around the shaft.

22. The system as defined in claim 20 wherein the resilient member has a first terminal end engaged with the shaft and a second terminal end engaged with the heat sink retention arm.

23. The system as defined in claim 19 wherein there are a plurality of spaced apart heat sink retention arms mounted on the shaft.

24. The system as defined in claim 19 further including:
   a detent mounted on the frame for engagement with the driving member.

25. The system as defined in claim 24 wherein the driving member engages the detent in the lock position and in the unlock position.

26. The system as defined in claim 19 wherein one of the arcuate members engages one of the grooves in the lock position and another of the arcuate members engages another one of the grooves in the unlock position.

27. The system as defined in claim 19 wherein the slot is between the grooves and the tab is between the arcuate members.

* * * * *